United States Patent
Song et al.

(10) Patent No.: US 10,600,940 B2
(45) Date of Patent: Mar. 24, 2020

(54) DISPLAY DEVICE

(71) Applicant: Samsung Display Co., Ltd., Yongin-si (KR)

(72) Inventors: Hee-kwang Song, Suwon-si (KR); Sanghyuck Yoon, Seoul (KR); Juyoung Yoon, Seoul (KR); Hyeonmi Lee, Tongyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/361,123

(22) Filed: Mar. 21, 2019

(65) Prior Publication Data

US 2019/0312181 A1   Oct. 10, 2019

(30) Foreign Application Priority Data

Apr. 10, 2018   (KR) .................. 10-2018-0041754

(51) Int. Cl.
| | |
|---|---|
| H01J 1/62 | (2006.01) |
| H01L 33/50 | (2010.01) |
| F21V 8/00 | (2006.01) |
| G02F 1/1335 | (2006.01) |
| H01L 33/62 | (2010.01) |
| H01L 33/56 | (2010.01) |
| H01L 33/32 | (2010.01) |

(52) U.S. Cl.
CPC .......... *H01L 33/504* (2013.01); *G02B 6/0026* (2013.01); *G02B 6/0073* (2013.01); *G02F 1/133603* (2013.01); *H01L 33/32* (2013.01); *H01L 33/56* (2013.01); *H01L 33/62* (2013.01); *G02F 2001/133614* (2013.01)

(58) Field of Classification Search
None
See application file for complete search history.

(56) References Cited

U.S. PATENT DOCUMENTS

| | | | |
|---|---|---|---|
| 7,847,303 B2 | 12/2010 | Jung et al. | |
| 8,017,972 B2 | 9/2011 | Lee et al. | |
| 8,344,611 B2 | 1/2013 | Im et al. | |
| 9,166,120 B2 * | 10/2015 | Moon | H01L 33/507 |

(Continued)

FOREIGN PATENT DOCUMENTS

| | | |
|---|---|---|
| KR | 10-2011-0048397 | 5/2011 |
| KR | 10-2012-0039631 | 4/2012 |
| KR | 10-1274046 | 6/2013 |

(Continued)

*Primary Examiner* — Vip Patel
(74) *Attorney, Agent, or Firm* — H.C. Park & Associates, PLC

(57) ABSTRACT

A display device including a light source member including a light-emitting device which emits a first light having a central wavelength in a wavelength region of about 390 nm to about 410 nm, and a first phosphor converting the first light into a second light having a central wavelength in a wavelength region of about 440 nm to about 460 nm, a display panel disposed on the light source member, and a color conversion layer disposed between the light source member and the display panel and including a luminous body which is excited by at least one of the first light or the second light and emits a light in a wavelength region which is different from that of the second light.

20 Claims, 11 Drawing Sheets

(56) References Cited

U.S. PATENT DOCUMENTS

2017/0125650 A1     5/2017   Pickett et al.
2019/0221724 A1     7/2019   Song et al.

FOREIGN PATENT DOCUMENTS

| KR | 10-2016-0015147 | 2/2016 |
| KR | 10-1655463 | 9/2016 |
| KR | 10-0783251 | 12/2017 |
| KR | 10-2019-0086611 | 7/2019 |

* cited by examiner

DISPLAY DEVICE

CROSS-REFERENCE TO RELATED APPLICATIONS

This application claims priority from and the benefit of Korean Patent Application No. 10-2018-0041754, filed on Apr. 10, 2018, which is hereby incorporated by reference for all purposes as if fully set forth herein.

BACKGROUND

Field

Exemplary embodiments of the invention relate generally to a display device, and more specifically, to a display device using a light-emitting source in a wavelength region of near-ultraviolet light rays.

Discussion of the Background

In order to provide image information, various types of display devices are used, and liquid crystal display devices are widely used as large-sized display devices, portable display devices, etc., thanks to the advantage of low consumption power. A liquid crystal display device, a structure in which quantum dots, etc., are applied to a light source member to increase luminous efficiency and color reproducibility has been suggested.

High color reproducibility and luminous efficiency are desirable in a display device and, in order to achieve these desirable characteristics, research is being conducted regarding a display device in which the combination of a light source and a luminous body is changed.

The above information disclosed in this Background section is only for understanding of the background of the inventive concepts, and, therefore, it may contain information that does not constitute prior art.

SUMMARY

Exemplary embodiments of the invention provide a display device having improved luminance characteristic.

Exemplary embodiments of the invention also provide a display device having improved luminous efficiency while showing excellent color reproducibility.

Additional features of the inventive concepts will be set forth in the description which follows, and in part will be apparent from the description, or may be learned by practice of the inventive concepts.

An exemplary embodiment of the invention provides a display device including a light source member including a light-emitting device which emits a first light having a central wavelength in a wavelength region of about 390 nm to about 410 nm, and a first phosphor converting the first light into a second light having a central wavelength in a wavelength region of about 440 nm to about 460 nm; a display panel disposed on the light source member; and a color conversion layer disposed between the light source member and the display panel and including a luminous body which is excited by at least one of the first light and the second light and emits a light in a wavelength region which is different from that of the second light.

The light source member may further include a second phosphor converting the second light into a third light having a central wavelength in a wavelength region of about 600 nm to about 650 nm.

The light source member may further include a sealing part covering the light-emitting device, and the first phosphor and the second phosphor may be included in the sealing part.

The light source member may further include a first sealing part covering the light-emitting device and including the first phosphor; and a second sealing part disposed on the first sealing part and including the second phosphor.

The color conversion layer may include a first luminous body which is excited by at least one of the first light and the second light and emits a fourth light having a central wavelength in a wavelength region of about 520 nm to about 550 nm.

The display device may include a first color conversion layer including a first luminous body which is excited by at least one of the first light and the second light and emits a fourth light having a central wavelength in a wavelength region of about 520 nm to about 550 nm; and a second color conversion layer disposed between the light source member and the first color conversion layer and including a second luminous body which is excited by at least one of the first light and the second light and emits a third light having a central wavelength in a wavelength region of about 600 nm to about 650 nm.

The first luminous body may be a green quantum dot.

The second luminous body may be a red phosphor or a red quantum dot.

The display device may further include a light guide plate disposed between the light source member and the display panel, and the light source member may be disposed adjacent to at least one side of the light guide plate.

The color conversion layer may be disposed on the light guide plate, and the display device may further include a low refractive layer disposed between the light guide plate and the color conversion layer and has a smaller refractive index than the light guide plate.

The light source member may be disposed under the color conversion layer, and the light source member may be overlapped with the display panel.

The display device may further include a barrier layer disposed on the color conversion layer and covers the color conversion layer.

The light-emitting device may include a first conductive-type semiconductor layer; an active layer disposed on the first conductive-type semiconductor layer and includes InGaN; and a second conductive-type semiconductor layer disposed on the active layer.

Another exemplary embodiment of the invention provides a display device including a light source member including a light-emitting device emitting near-ultraviolet light rays and a blue phosphor converting the near-ultraviolet light rays into blue light; a display panel disposed on the light source member; and a color conversion layer disposed between the light source member and the display panel and includes a luminous body which is excited by at least one of the near-ultraviolet light rays and the blue light and emits a light in a wavelength region which is different from that of the blue light.

The light source member may further include a red phosphor converting the blue light into red light.

The luminous body may include a green quantum dot.

The color conversion layer may include a first color conversion layer including a first luminous body emitting green light; and a second color conversion layer disposed under the first color conversion layer and includes a second luminous body emitting red light.

The first luminous body may be a green quantum dot, and the second luminous body may be a red phosphor.

Another exemplary embodiment of the invention discloses a display device including a display panel; a light guide plate disposed under the display panel; a light source member disposed adjacent to at least one side of the light guide plate; and a color conversion layer disposed between the display panel and the light guide plate. The light source member includes a light-emitting device which includes an active layer including InGaN but does not AlGaN, and emits near-ultraviolet light rays; a blue phosphor converting the near-ultraviolet light rays into blue light; and a red phosphor converting the blue light into red light. The color conversion layer includes a quantum dot which is excited by at least one light of the near-ultraviolet light rays and the blue light and emits green light.

The light-emitting device may emit the near-ultraviolet light rays which have a central wavelength in a wavelength region of about 390 nm to about 410 nm.

The light source member may include a first sealing part disposed on the light-emitting device and includes the blue phosphor; and a second sealing part disposed on the first sealing part and includes the red phosphor.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
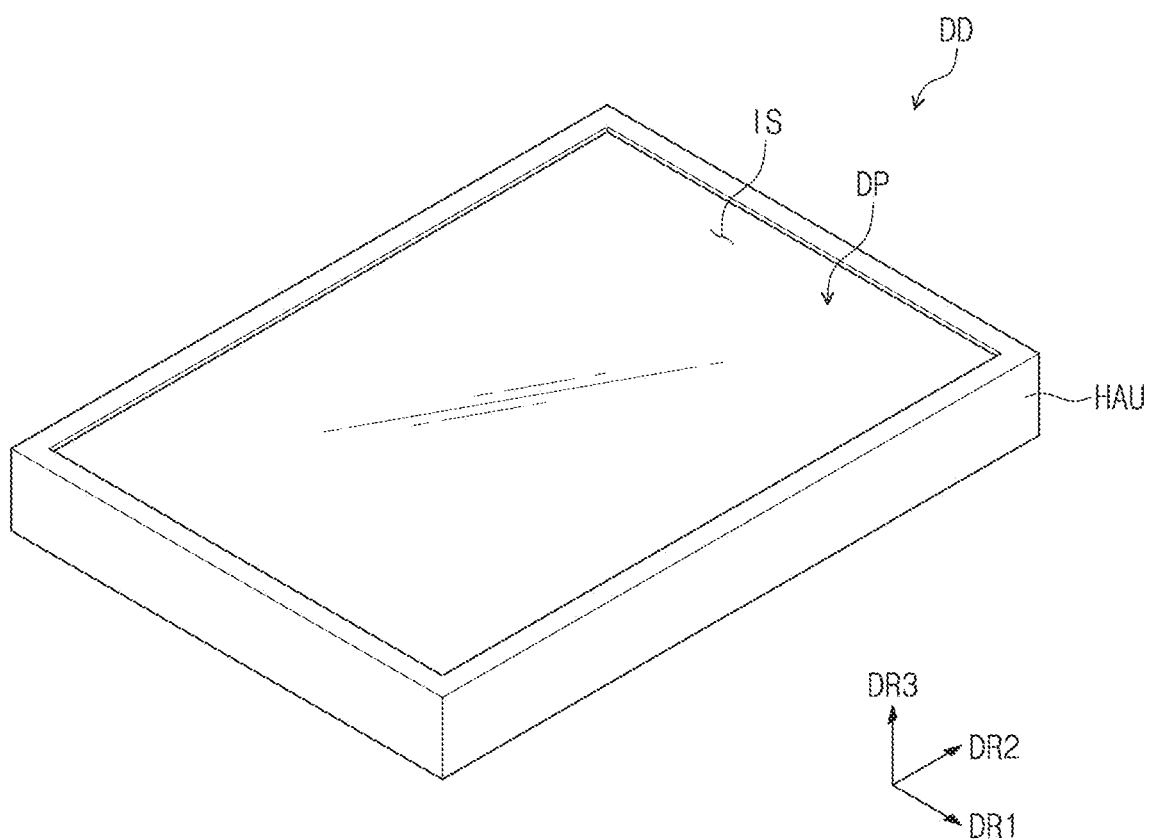
FIG. 1 is a perspective view of a display device of an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an exemplary embodiment of the invention will be explained with reference to the accompanying drawings.

Figure 2:
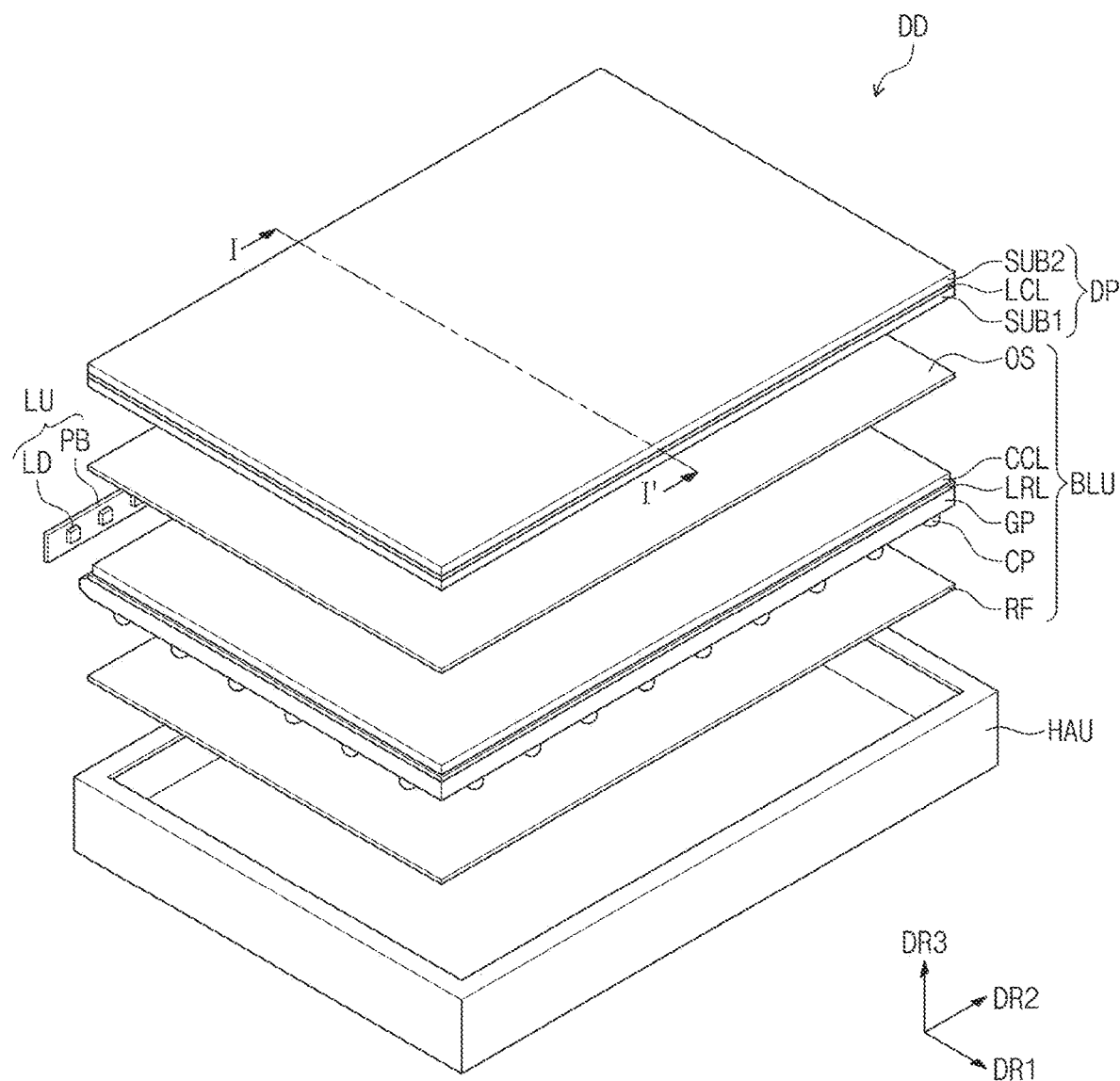
FIG. 2 is an exploded perspective view of a display device of an exemplary embodiment of the invention.
Figure 3:
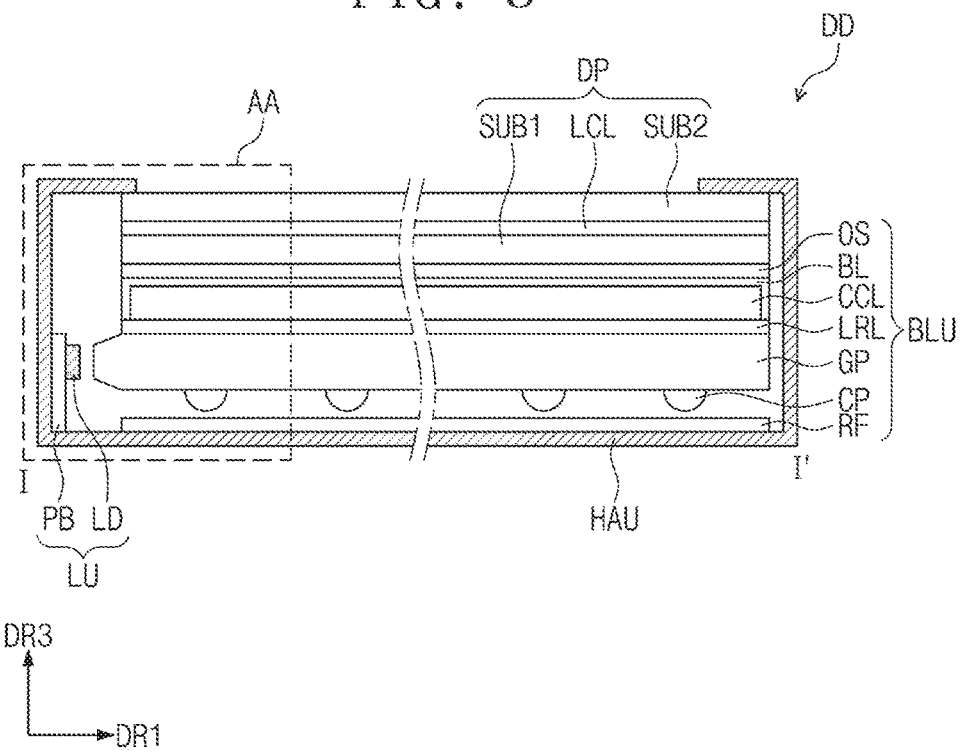
FIG. 3 is a cross-sectional view of a part corresponding to line I-I' of FIG. 2.
Figure 4:
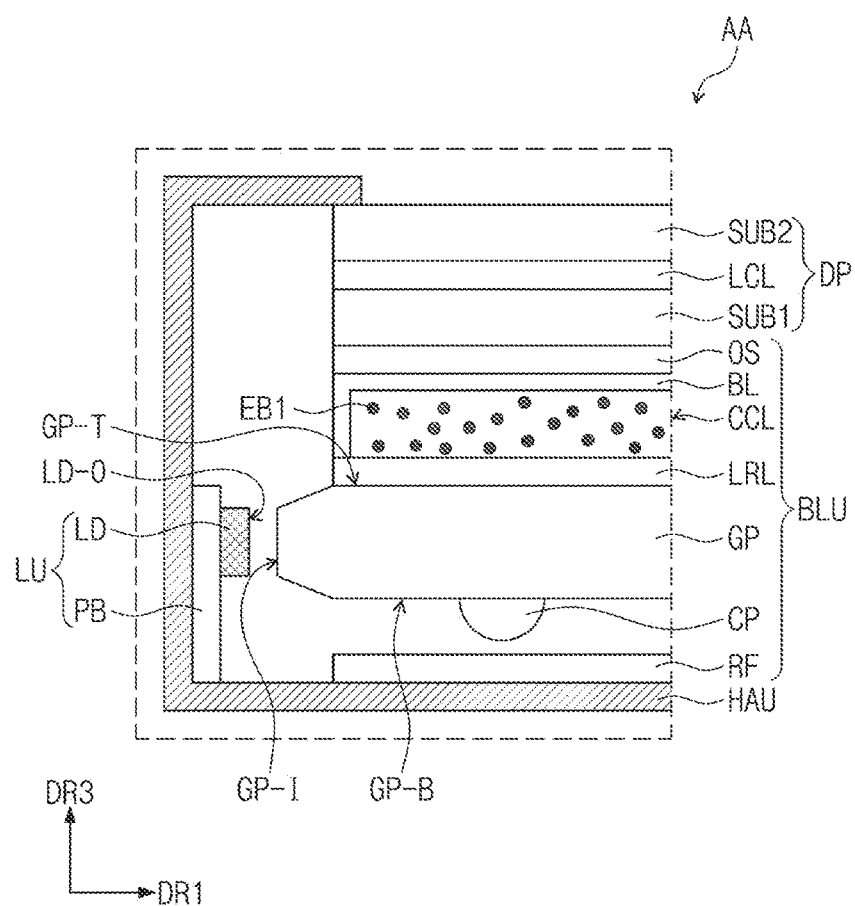
FIG. 4 is an enlarged view of an AA region of FIG. 3.
Figure 5:
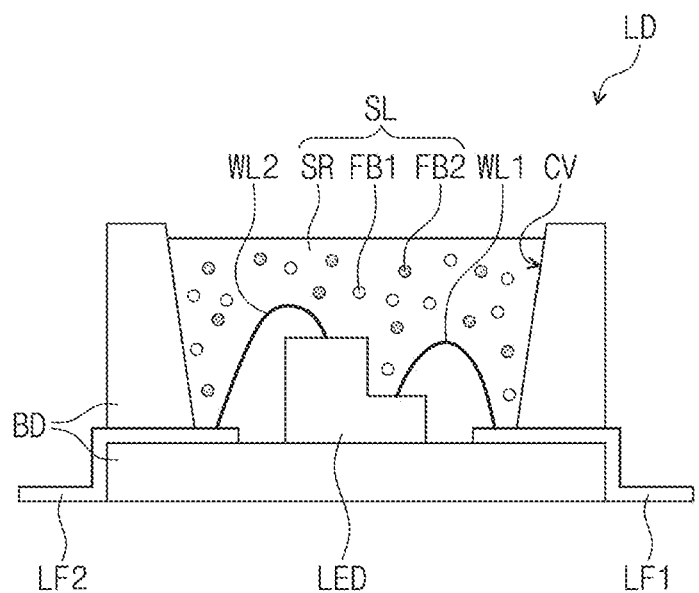
FIG. 5 is a cross-sectional view showing a light-emitting device package according to an exemplary embodiment of the invention.

FIG. 1 is a perspective view of a display device of an exemplary embodiment. FIG. 2 is an exploded perspective view of a display device of an exemplary embodiment. FIG. 3 is a cross-sectional view of a part corresponding to line I-I' of FIG. 2. FIG. 4 is an enlarged cross-sectional view of an AA region of FIG. 3, and FIG. 5 is a cross-sectional view showing a light-emitting device package according to an exemplary embodiment.

Referring to FIG. 1, a display device DD of an exemplary embodiment may include a display panel DP and a housing HAU storing the display panel DP and a light source member LU (FIG. 2). The housing HAU may be disposed to cover the display panel DP such that a top surface, which is an indication surface IS of the display panel DP, is exposed. That is, the housing HAU may cover a part of the top surface as well as the side and the bottom surface of the display panel DP. However, the inventive concepts are not limited thereto. The housing HAU may cover the side and the bottom surface and expose the entire top surface of the display panel DP.

A first directional axis DR1, a second directional axis DR2, and a third directional axis DR3 are shown in FIG. 1. The directional axes explained herein are relative, and for convenience of explanation, the third directional axis DR3 may be defined as a direction to which images are provided toward users. In addition, the first directional axis DR1 and the second directional axis DR2 may cross at right angles, and the third directional axis DR3 may be normal to a plane defined by the first directional axis DR1 and the second directional axis DR2. In FIG. 1, the plane defined by the first directional axis DR1 and the second directional axis DR2 may be an indication surface IS, which provides images.

FIG. 2 is an exploded perspective view of a display device DD of an exemplary embodiment, and the display device DD may include a light source member LU, a display panel DP disposed on the light source member LU, and a color conversion layer CCL disposed between the light source member LU and the display panel DP.

The display device DD may include a backlight unit BLU disposed under the display panel DP, and a housing HAU storing the display panel DP and the backlight unit BLU.

In the display device DD, the backlight unit BLU may include optical members transferring light provided from the light source member LU to the display panel DP such as a light guide plate GP, a light output pattern part CP, an optical sheet OS, a low refractive layer LRL, and a reflection layer RF. In addition, the backlight unit BLU may include a color conversion layer CCL for converting the wavelength region of light provided from the light source member LU.

Referring to FIGS. 2 to 5, the light source member LU may include a circuit substrate PB and a light-emitting device package LD disposed on the circuit substrate PB. The light-emitting device package LD may include a light-emitting device LED and a sealing part SL covering the light-emitting device LED.

The circuit substrate PB may supply power toward the light-emitting device package LD. For example, the circuit substrate PB may provide the installed light-emitting device package LD with dimming signals and a driving voltage. The circuit substrate PB may be formed by including at least one insulation layer (not shown) and at least one circuit layer (not shown). For example, the circuit substrate PB may be a metal core printed circuit board MCPCB.

On the circuit substrate PB, a plurality of light-emitting device packages LD may be disposed. The plurality of the light-emitting device packages LD may emit light in the same wavelength region. The light-emitting device package LD included in the light source member LU may include a light-emitting device LED, a pair of lead frames LF1 and LF2, and a body part BD. The light-emitting device LED may produce light in correspondence to a voltage supplied from the circuit substrate PB.

The body part BD may receive and fix the light-emitting device LED and may fix the first lead frame LF1 and the second lead frame LF2. The body part BD may be composed of a material such as a polymer resin. In addition, the body part BD may have a cavity CV, and the cavity CV may be a space for installing the light-emitting device LED. The first and second lead frames LF1 and LF2 may provide the light-emitting device LED with power. In addition, the first lead frame LF1 and the second lead frame LF2 may each penetrate a part of the body part BD.

The light-emitting device LED is disposed in the cavity CV of the body part BD, and in the cavity CV, a sealing part SL, which wraps the light-emitting device LED and filling therein, may be disposed. The sealing part SL may play the role of protecting the light-emitting device LED. In addition, the sealing part SL may include a filling resin SR. The filling resin SR may use an epoxy resin or an acrylic resin.

The light-emitting device LED may emit a first light having a central wavelength in a wavelength region of about 390 nm to about 410 nm. That is, in an exemplary embodiment, the light-emitting device LED may emit near-ultraviolet light rays.

The light source member LU may include a first phosphor FB1, which converts the near-ultraviolet light rays, i.e., the first light emitted from the light-emitting device LED, into a second light, which has a central wavelength in a wavelength region of about 440 nm to about 460 nm. For example, the first phosphor FB1 may be a blue phosphor, which absorbs the near-ultraviolet light rays, i.e., the first light, and emits blue light. The light source member LU may further include a second phosphor which converts the second light into a third light, which has a central wavelength in a wavelength region of about 600 nm to about 650 nm. That is, the light source member LU may further include a red phosphor which absorbs blue light, i.e., the second light, and emits red light.

In an exemplary embodiment, the first phosphor FB1 and the second phosphor FB2 may be included in the light-emitting device package LD. For example, the first phosphor FB1 and the second phosphor FB2 may be included in the sealing part SL.

In an exemplary embodiment, the first phosphor FB1 may be excited by near-ultraviolet light rays emitted from the light-emitting device LED and emit blue light, and the second phosphor FB2 may be excited by the blue light emitted from the first phosphor FB1 and emit red light. That is, in an exemplary embodiment, the light-emitting device package LD may emit blue light and red light to provide a light guide plate GP with blue light and red light.

Figure 6:
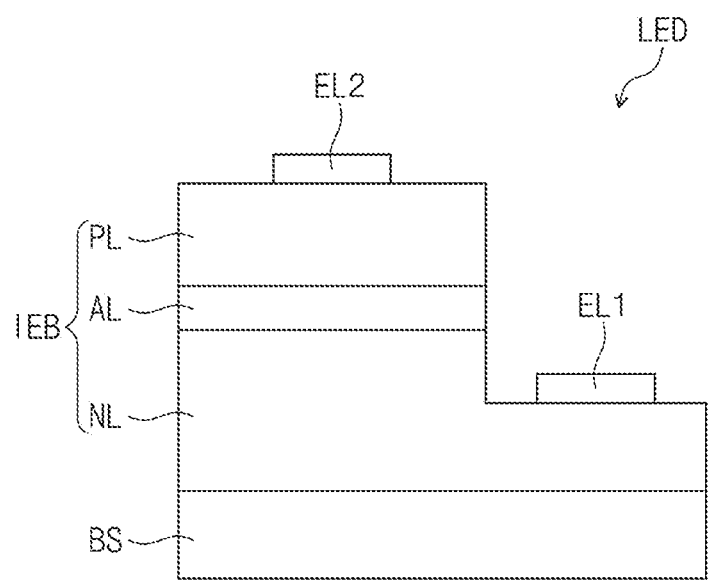
FIG. 6 is a cross-sectional view showing a light-emitting device according to an exemplary embodiment of the invention.

FIG. 6 is a cross-sectional view showing the light-emitting device LED included in the light-emitting device package LD shown in FIG. 5. The light-emitting device LED may include a supporting substrate BS, a light-emitting structure IEB disposed on the supporting substrate BS, and a first electrode EL1 and a second electrode EL2 disposed on the light-emitting structure IEB.

The supporting substrate BS may include a sapphire substrate, or at least one of GaN, SiC, ZnO, GaP, InP, $Ga_2O_3$, GaAs, or Si. The supporting substrate BS may play the role of supporting the light-emitting structure IEB.

The light-emitting structure IEB may include a first conductive-type semiconductor layer NL, an active layer AL, and a second conductive-type semiconductor layer PL. The first conductive-type semiconductor layer NL may be embodied using a III-V group or II-VI group compound semiconductor, which is doped with a first conductive-type dopant. For example, if the first conductive-type is an n-type, Si, Ge, Sn, Se, Te, etc., may be included as the n-type dopant, but the inventive concepts are not limited thereto.

The active layer AL is disposed on the first conductive-type semiconductor layer NL. The active layer AL may be a layer emitting light having energy which is determined by the intrinsic energy bend of a material forming the active layer AL through the recombination of electrons injected from the first conductive-type semiconductor layer NL and holes injected via the second conductive-type semiconductor layer PL. The active layer AL may have a single well structure, a multi-well structure, a single quantum well structure, a multi-quantum well structure, etc. For example, the active layer AL may have the multi-quantum well structure, and may include InGaN.

The active layer AL need not include AlGaN. In an exemplary embodiment, the light-emitting device LED need not include AlGaN, but may instead include InGaN in the active layer AL to maintain sufficient output and to effectively emit near-ultraviolet light rays. That is, in an embodiment, the light source member LU may include the light-emitting device LED including InGaN in the active layer AL and may show high luminous efficiency.

The second conductive-type semiconductor layer PL is disposed on the active layer AL. The second conductive-type semiconductor layer PL may be formed using a III-V group or II-VI group compound semiconductor. For example, if the second conductive-type is a p-type, the second conductive-type semiconductor layer PL may include Mg, Zn, Ca, Sr, Ba, etc. as the p-type dopant, but the inventive concepts are not limited thereto.

Referring to FIG. 6, the first electrode EL1 of the light-emitting device LED may be disposed on the first conductive-type semiconductor NL, which is exposed by mesa etching the second conductive-type semiconductor layer PL, the active layer AL, and a part of the first conductive-type semiconductor layer NL. The second electrode EL2 may be disposed on the second conductive-type semiconductor layer PL. The first and second electrodes EL1 and EL2 may be provided as a single layer or multi-layer structure by including at least one of aluminum (Al), titanium (Ti), chromium (Cr), nickel (Ni), copper (Cu), and gold (Au).

Referring to FIG. 5 again, the light-emitting device LED may be electrically connected via connecting wires WL1 and WL2 with lead frames LF1 and LF2, which are exposed in the cavity CV. The structure of the light-emitting device LED is not limited to the structure shown in FIG. 6., etc., but light-emitting devices having various types and light-emitting structures which emit near-ultraviolet light rays having a central wavelength in a wavelength region of about 390 nm to about 410 nm, may be applied. For example, light-emitting devices having a vertical-type bonding structure may be used in addition to light-emitting devices having a horizontal-type bonding structure as shown in FIG. 6, without limitation.

In the light-emitting device package LD, the sealing part SL may include the filling resin SR together with a first phosphor FB1 and a second phosphor FB2, which are dispersed in the filling resin SR.

The first phosphor FB1 may be a blue phosphor. For example, the blue phosphor may be a barium (Ba), magnesium (Mg), or aluminum oxide-based material, and a BAM-based compound, which is a europium (Eu) compound.

The second phosphor FB2 may be a red phosphor, and the red phosphor may include at least one of a nitride-based red phosphor, a fluoride-based red phosphor, a silicate-based red phosphor, a sulfide-based red phosphor, a selenide-based red phosphor, an oxynitride-based red phosphor, a molybdenum-based red phosphor, a tantalate-based red phosphor, carbide-nitrides, a tungstate-based red phosphor, $Sr_2MgAl_{22}O_{36}:Mn^{4+}$, $(Ba,Sr,Ca)_2MgAl_{16}O_{27}:Eu^{2+}$, $(Ba,Sr,Ca)_2MgAl_{16}O_{27}:Mn^{2+}$, $Sr_4Al_{14}O_{460}:Eu^{2+}$, or $Mg_4O_{5.5}GeF:Mn^{4+}$.

More specifically, the second phosphor FB2 may be a nitride-based red phosphor or a fluoride-based red phosphor. The nitride-based red phosphor may be, for example, $(Sr,Ca)AlSiN_3:Eu$, $(Sr,Ca)AlSi(ON)_3:Eu$, $(Sr,Ca)_2Si_5N_8:Eu$, $(Sr,Ca)_2Si_5(ON)_8:Eu$, $(Sr,Ba)SiAl_4N_7:Eu$, $CaAlSiN_3:Eu^{2+}$, $(Sr,Ca)AlSiN_3:Eu^{2+}$, or $Sr_2Si_5N_8:Eu^{2+}$. The fluoride-based red phosphor may be $K_2SiF_6:Mn^{4+}$, $K_2TiF_6:Mn^{4+}$, $ZnSiF_6:Mn^{4+}$, $Na_2SiF_6:Mn^{4+}$, or $Mg_4O_{5.5}GeF:Mn^{4+}$.

The second phosphor FB2 may include at least one of a nitride-based red phosphor or a fluoride-based red phosphor. Particularly, the second phosphor FB2 may be $K_2SiF_6:Mn^{4+}$ (KSF phosphor).

Figure 7:
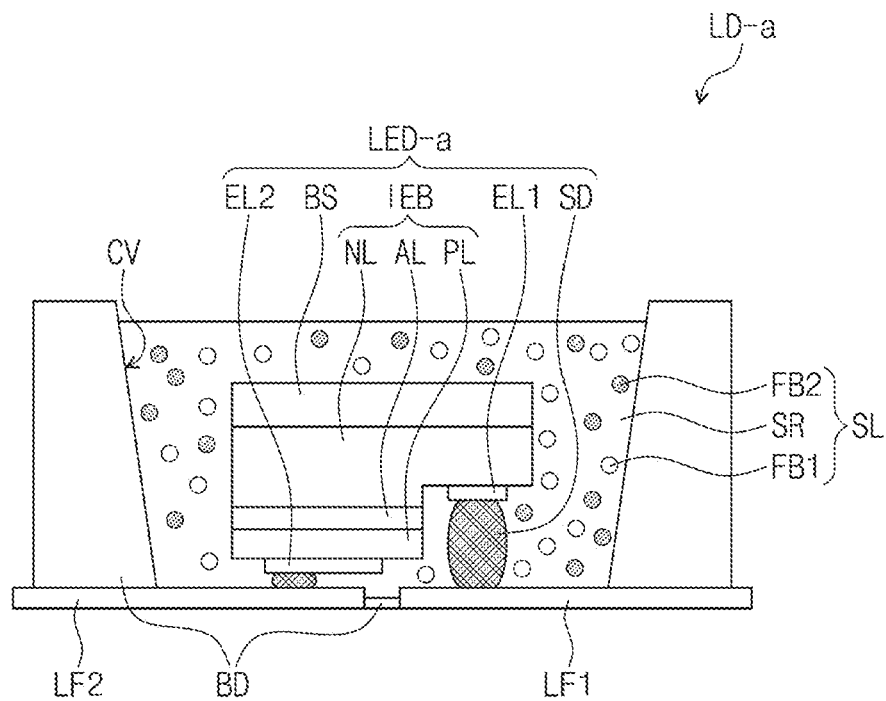
FIG. 7 is a cross-sectional view showing a light-emitting device package according to an exemplary embodiment of the invention.

FIG. 7 is a diagram showing another exemplary embodiment of a light-emitting device package LD-a. The light-emitting device package LD-a may include a light-emitting device LED-a, a pair of lead frames LF1 and LF2, and a body part BD.

In the exemplary embodiment shown in FIG. 7, the light-emitting device LED-a may be a light-emitting device of a flip chip type. The light-emitting device LED-a shown in FIG. 7 has a flip chip bonding structure and may include a supporting substrate BS, a light-emitting structure IEB, a first electrode EL1, and a second electrode EL2. In addition, a solder part SD fixing the first and second electrodes EL1 and EL2 to first and second lead frames LF1 and LF2, respectively, may be included. That is, in the light-emitting device LED-a according to this exemplary embodiment, a first conductive-type semiconductor layer NL may be electrically connected with the first lead frame LF1 via the first electrode EL1 and the solder part SD, and a second conductive-type semiconductor layer PL may be electrically connected with the second lead frame LF2 via the second electrode EL2 and the solder part SD.

Referring to FIG. 7, the light-emitting structure IEB may be disposed under the supporting substrate BS. The light-emitting structure IEB may include the first conductive-type semiconductor layer NL, an active layer AL, and the second conductive-type semiconductor layer PL, which are laminated in order from the supporting substrate BS in a downward direction. Under the exposed first conductive-type semiconductor device NL, the first electrode EL1 may be disposed, and under the second conductive-type semiconductor layer PL, the second electrode EL2 may be disposed. With respect to the supporting substrate BS, the light-emitting structure IEB, the first electrode EL1, and the second electrode EL2, the same explanation on the light-emitting device LED of FIG. 6 above may be applied.

The light-emitting device package LD-a of FIG. 7 may include a light-emitting device LED-a and a sealing part SL. The light-emitting device LED-a may emit a first light having a central wavelength in a wavelength region of about 390 nm to about 410 nm. That is, the light-emitting device LED-a may emit near-ultraviolet light rays.

The sealing part SL may include a first phosphor FB1 and a second phosphor FB2. The first and second phosphors FB1 and FB2 may be dispersed and disposed in the filling resin SR. The first phosphor FB1 may be a blue phosphor which is excited by near-ultraviolet light rays emitted from the light-emitting device LED-a and emits blue light, and the second phosphor FB2 may be a red phosphor which is excited by the blue light emitted from the blue phosphor and emits red light. With respect to the first phosphor FB1 and the second phosphor FB2, the same explanation referring to FIGS. 5 and 6 may be applied. For example, the second phosphor FB2 may be a KSF phosphor.

The display device DD of the exemplary embodiment shown in FIGS. 2 to 4 may include the light-emitting device LED and the light-emitting device package LD shown in FIGS. 5 and 6. In addition, the display device DD of the exemplary embodiment shown in FIGS. 2 to 4 may include the light-emitting device package shown in FIG. 7 in the light source member LU. However, the inventive concepts are not limited thereto, and various types of light-emitting devices which emit near-ultraviolet light rays may be used in the display device DD, in addition to the light-emitting devices LED and LED-a shown in FIGS. 5 to 7.

In the display device DD of the exemplary embodiment shown in FIGS. 2 to 4, the light source member LU may be disposed to face at least one side of a light guide plate GP. The light-emitting surface LD-O of the light-emitting device package LD may face one side GP-1 of the light guide plate GP. Meanwhile, in the exemplary embodiment shown in FIGS. 3 and 4, the one side of the light guide plate GP which is adjacent to the light source member LU is shown to have a cross-section inclined toward an incident surface, which is the one side GP-1. However, the inventive concepts are not limited thereto.

Light emitted from the light-emitting device package LD may be incident to the light guide plate GP. A light output pattern part CP may be disposed on the bottom surface GP-B of the light guide plate GP. The light output pattern part CP may be provided on the bottom surface GP-B of the light guide plate GP and may have a convexly protruded shape toward a housing HAU. For example, the light output pattern part CP may have a convex lens shape toward the housing HAU. However, the inventive concepts are not limited thereto.

The light output pattern part CP may be formed using a material having a refractive index value different from that of the light guide plate GP. The light output pattern part CP transfers light emitted from the light source member LU and incident to one side of the light guide plate GP to another side of the light guide plate GP, or changes the direction of light incident to the direction of the bottom surface GP-B of the light guide plate GP to a direction of a light output surface which is the top surface GP-T of the light guide plate GP. The light output pattern part CP may change the route of light supplied to the bottom surface GP-B of the light guide plate GP so as to emit the light toward the display panel DP.

On the light guide plate GP, a low refractive layer LRL may be disposed. For example, the low refractive layer LRL may be coated and formed on the top surface GP-T of the light guide plate GP. Coating methods for forming the low refractive layer LRL may include slit coating, spin coating, roll coating, spray coating, ink jet printing, etc., but the supplying method of the low refractive layer LRL is not limited thereto. The low refractive layer LRL may instead be provided directly on the light guide plate GP using various methods, such as a transfer method.

The refractive index of the low refractive layer LRL may be smaller than the refractive index of the light guide plate GP. The refractive index of the low refractive layer LRL may be smaller than the refractive index of the color conversion layer CCL, which is provided on the low refractive layer LRL. The refractive index of the low refractive layer LRL may be from about 1.2 to about 1.4. For example, the refractive index of the low refractive layer LRL may be from about 1.2 to about 1.25. The difference between the refractive index of the low refractive layer LRL and the refractive index of the light guide plate GP may be about 0.2 or more. The low refractive layer LRL has a smaller refractive index than the light guide plate GP, and may effectively transfer light incident to the light guide plate GP from the light source member LU to the other side of the light guide plate GP, which is separated from the light source member LU.

On the light guide plate GP, a color conversion layer CCL may be disposed. For example, the color conversion layer CCL may be disposed on the low refractive layer LRL. The color conversion layer CCL may be disposed between the light source member LU and the display panel DP, and may include a luminous body which emits light which is excited by at least one light of a first light emitted from the light-emitting device package LD and a second light emitted from the first phosphor FB1 and emits light in a wavelength region different from the second light. The color conversion layer CCL may be provided on the light guide plate GP by a coating process. For example, the color conversion layer CCL may be directly disposed on the low refractive layer LRL.

The color conversion layer CCL may include a first luminous body EB1, which is excited by at least one light among the first light emitted from the light-emitting device LED and the second light emitted from the first phosphor, and emits a fourth light having a central wavelength in a wavelength region of about 520 nm to about 550 nm. For example, the first luminous body EB1 may be a quantum dot. Particularly, the first luminous body EB1 may be a green quantum dot. The first luminous body EB1 may be a green quantum dot, which is excited by near-ultraviolet light rays emitted from the light-emitting device LED or blue light emitted from the first phosphor FB1 and emits green light.

The quantum dot may be a particle converting the wavelength of light supplied from the light source member LU. The quantum dot is a material having a crystalline structure with a size of several nanometers, is composed of hundreds to thousands of atoms, and shows a quantum confinement effect by which energy band gap is increased as a result of its small size. In the case where light with a wavelength having higher energy than the band gap strikes the quantum dot, the quantum dot absorbs this light and is excited, and then, returns to a ground state while emitting light with a specific wavelength. The light with the wavelength thus emitted has a value corresponding to the band gap. The quantum dot may control emission characteristics due to quantum confinement effect by controlling the size and composition thereof. The color of the light thus emitted may be changed according to the particle size of the quantum dot, and the quantum dot may emit light in a short wavelength region according to the decrease of its size. For example, the particle size of the quantum dot emitting green light may be smaller than the particle size of the quantum dot emitting red light.

The quantum dot may be selected from II-VI group compounds, III-V group compounds, IV-VI group compounds, IV group compounds, IV group compounds and a combination thereof.

The II-VI group compound may be selected from the group consisting of binary compounds selected from the group consisting of CdSe, CdTe, ZnS, ZnSe, ZnTe, ZnO, HgS, HgSe, HgTe, MgSe, MgS, and a mixture thereof, ternary compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The III-V group compound may be selected from the group consisting of binary compounds selected from the group consisting of GaN, GaP, GaAs, GaSb, AlN, AlP, AlAs, AlSb, InN, InP, InAs, InSb, and a mixture thereof, ternary compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and quaternary compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a s mixture thereof.

The IV-VI group compound may be selected from the group consisting of binary compounds selected from the group consisting of SnS, SnSe, SnTe, PbS, PbSe, PbTe, and a mixture thereof, ternary compounds selected from the group consisting of SnSeS, SnSeTe, SnSTe, PbSeS, PbSeTe, PbSTe, SnPbS, SnPbSe, SnPbTe, and a mixture thereof, and quaternary compounds selected from the group consisting of SnPbSSe, SnPbSeTe, SnPbSTe, and a mixture thereof. The IV group compound may be selected from the group consisting of Si, Ge, and a mixture thereof. The IV group compound may be a binary compound selected from the group consisting of SiC, SiGe, and a mixture thereof.

In this case, the binary compound, the ternary compound or the quaternary compound may be present at uniform concentration in the particle, or may be present at partially different concentration distribution states in the same particle.

The quantum dot may have a core-shell structure including a core and a shell wrapping the core. In addition, a core/shell structure in which one quantum dot wraps another quantum dot may be possible. The interface of the core and the shell may have a concentration gradient in which the concentration of elements present in the shell is decreased toward a center.

The quantum dot may be a particle having a size of a nanometer scale. The quantum dot may have a full width of half maximum (FWHM) of emission wavelength spectrum of about 45 nm or less, preferably, about 40 nm or less, more preferably, about 30 nm or less. Within this range, color purity or color reproducibility may be improved. In addition, light emitted via such quantum dot is emitted in all directions, and a light view angle may be improved.

In addition, the shape of the quantum dot may include generally used shapes in the art, without special limitation.

More particularly, spherical, pyramidal, multi-arm, or cubic nanoparticle, nanotube, nanowire, nanofiber, nanoplate particles, etc., may be used.

That is, in the display device DD of an exemplary embodiment, the light source member LU may include the first phosphor FB1 and the second phosphor FB2 in the light-emitting device package LD and supplies blue light and red light, and the color conversion layer CCL may be excited by blue light and near-ultraviolet light rays and emit green light. Accordingly, light penetrating the color conversion layer CCL and supplied to the display panel DP may be white light. That is, the display panel DP may be provided with mixed light of blue light emitted from the first phosphor FB1, red light emitted from the second phosphor FB2, and green light emitted from the first luminous body EB1.

The first luminous body EB1 of the color conversion layer CCL may be excited by near-ultraviolet light rays emitted from the light-emitting device LED and emit green light, and the first luminous body EB1 which is excited by near-ultraviolet light rays may show higher emission efficiency when compared to a case when excited by blue light. Accordingly, the display device DD including the color conversion layer CCL, which includes the light-emitting device LED which emits near-ultraviolet light rays, and the quantum dot, which is excited by near-ultraviolet light rays, may show excellent color reproducibility and high luminance characteristics due to the increased emission efficiency of the color conversion layer.

A barrier layer BL may be further included on the color conversion layer CCL. The barrier layer BL may play the role of preventing the permeation of moisture and/or oxygen (hereinafter, referred to "moisture/oxygen"). The barrier layer BL may be disposed on the color conversion layer CCL to block the exposure of the color conversion layer CCL to moisture/oxygen. Meanwhile, the barrier layer BL may cover the color conversion layer CCL.

The barrier layer BL may include at least one inorganic layer. That is, the barrier layer BL may be formed by including an inorganic material. For example, the barrier layer BL may be formed by including silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, or a metal thin film of which light transmittance is secured. Meanwhile, the barrier layer BL may further include an organic layer. The barrier layer BL may be configured as a single layer or a multi-layer.

On the color conversion layer CCL, an optical sheet OS may be further disposed. The optical sheet OS may include a prism sheet, etc., and a plurality of sheets may be laminated. The optical sheet OS increases the light concentration degree of light penetrated the color conversion layer CCL and increases the quantity of light supplied to the display panel DP.

The display device DD may further include a reflection layer RF. The reflection layer RF may be disposed under the light guide plate GP. The reflection layer RF may be disposed to face the light output pattern part CP. The reflection layer RF may include a reflection film or a reflection coating layer. The reflection layer RF reflects light emitted to the bottom surface GP-B of the light guide plate GP to penetrate into the light guide plate GP again.

The display device DD may include the display panel DP disposed on the color conversion layer CCL. The display panel DP may be a liquid crystal display panel. The display panel DP may include oppositely disposed first substrate SUB1 and second substrate SUB2, and a liquid crystal layer LCL disposed between the first substrate SUB1 and the second substrate SUB2.

Figure 8:
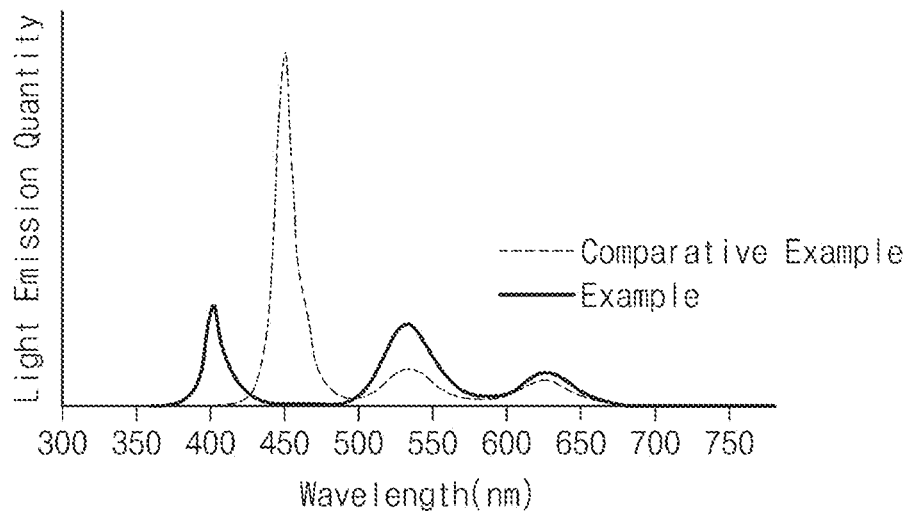
FIG. 8 is a diagram showing emission spectra of an example and a comparative example.

FIG. 8 is a graph showing the light emission quantity of an example which includes a light-emitting device emitting near-ultraviolet light rays and a green quantum dot, which is excited by near-ultraviolet light rays and emits light, and the light emission quantity of a comparative example which includes a light-emitting device emitting blue light and a green quantum dot which is excited by blue light and emits light.

Referring to FIG. 8, the quantity of emitted green light having a central wavelength of about 520 nm to about 550 nm was found to increase when compared to the comparative example. That is, a display device having high emission efficiency may be accomplished by changing the light-emitting wavelength region of the light-emitting device to the wavelength region of near-ultraviolet light rays.

Figure 9:
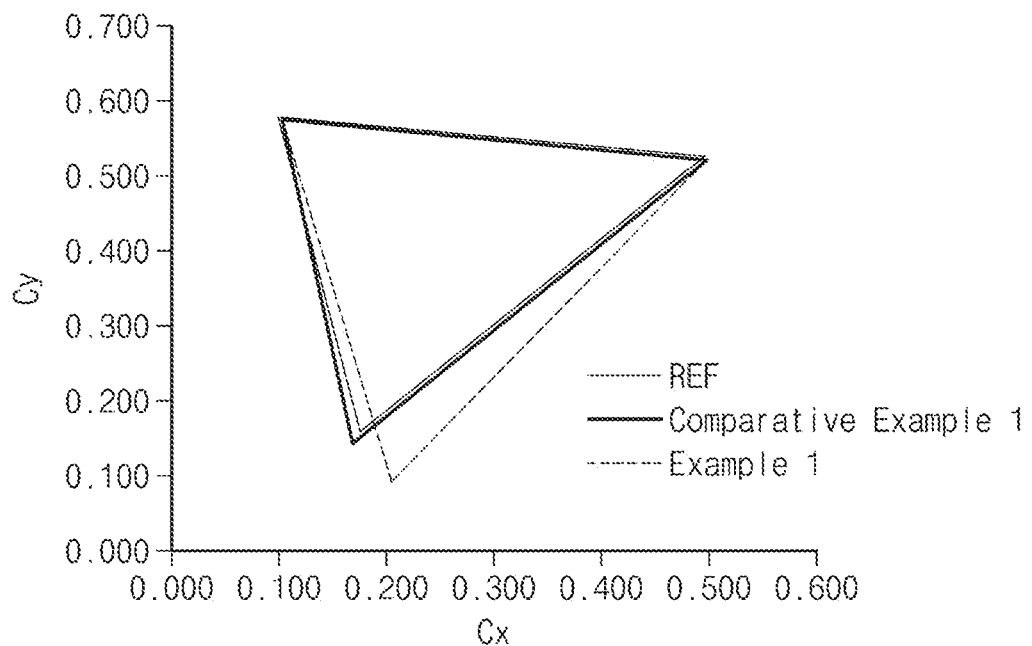
FIG. 9 shows color coordinates on display devices of a comparative example and an example.

The display device may include a light-emitting device which emits near-ultraviolet light rays and show high color reproducibility and excellent color sense. FIG. 9 shows the color coordinate of a display device of an exemplary embodiment and the color coordinate of a display device of a comparative example in comparison with DCI reference. Comparative Example 1 of FIG. 9 shows a color coordinate on a display device in which a light-emitting device emits blue light, and a light-emitting device package includes a light source member including a KSF phosphor. In addition, Example 1 of FIG. 9 shows a color coordinate of a display device of an exemplary embodiment, which includes a light source member including a first phosphor converting a first light into a second light having a central wavelength in a wavelength region of about 440 nm to about 460 nm, and a second phosphor converting the second light into a third light having a central wavelength in a wavelength region of about 600 nm to about 650 nm in a light-emitting device package.

In Comparative Example 1, it was found that the color coordinate of blue color deviated from the blue color coordinate of DCI reference (REF). In comparison, in Example 1, it was found that color reproducibility, which was an area formed by three color coordinates (R, G, B color coordinates), was partially increased against DCI reference (REF), and the change of a blue color coordinate was not significant when compared to DCI reference (REF).

Accordingly, the display device of an exemplary embodiment may achieve excellent color reproducibility and high emission efficiency by including a light source member, which includes a light-emitting device which emits near-ultraviolet light rays, and a blue phosphor, which is excited by near-ultraviolet light rays and emits blue light on the light-emitting device.

Figure 10:
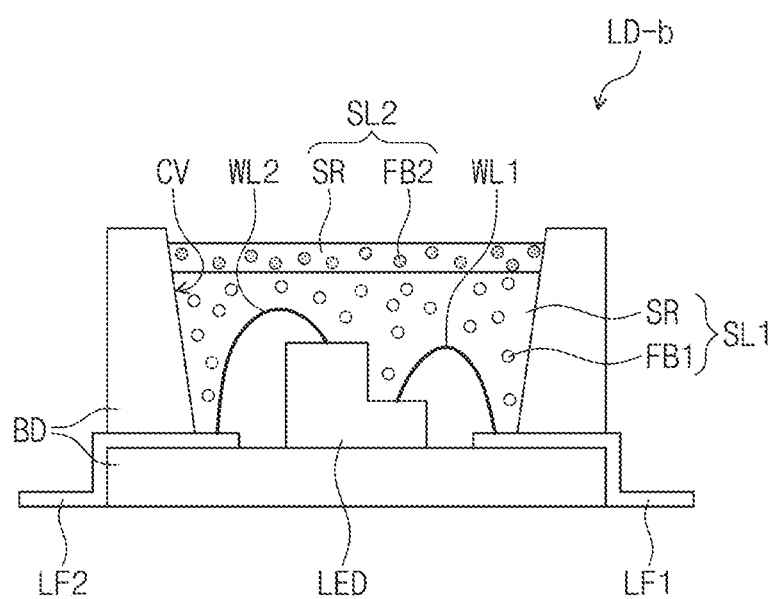
FIG. 10 is a cross-sectional view showing a light-emitting device package included in a display device DD, according to another exemplary embodiment of the invention.

FIG. 10 is a cross-sectional view showing a light-emitting device package which included in the display device DD according to another exemplary embodiment. Referring to FIG. 10, a light-emitting device package LD-b may include a light-emitting device LED, and a is first sealing part SL1 and a second sealing part SL2 disposed on the light-emitting device LED. The first sealing part SL1 may be disposed while covering the light-emitting device LED and include a filling resin SR and a first phosphor FB1. In addition, the second sealing part SL2 may be disposed on the first sealing part SL1 and include a filling resin SR and a second phosphor FB2. In the exemplary embodiment of the light-emitting device package LD-b as shown in FIG. 10, the first phosphor FB1 may be excited by a first light having a central wavelength in a wavelength region of about 390 nm to about 410 nm, which is emitted from the light-emitting device LED, and emits a second light having a central wavelength in a wavelength region of about 440 nm to about 460 nm. In addition, the second phosphor FB2 may be excited by the second light having a central wavelength in a wavelength region of about 440 nm to about 460 nm and emits a third light having a central wavelength in a wavelength region of about 600 nm to about 650 nm. That is, the first phosphor FB1 is a blue phosphor which is excited by near-ultraviolet light rays and emits blue light, and the second phosphor FB2 is a red phosphor which is excited by blue light and emits red light.

The light-emitting device package LD-b of the exemplary embodiment shown in FIG. 10 may emit near-ultraviolet light rays and may include the first phosphor FB1 and the second phosphor FB2 to emit blue light and red light. The light-emitting device package LD-b shown in FIG. 10 is different from the light-emitting device package LD shown in FIG. 5 in that the first sealing part SL1, which includes the first phosphor FB1, and the second sealing part SL2, which includes the second phosphor FB2, are separately provided. That is, in the light-emitting device package LD-b shown in FIG. 10, the first sealing part SL1 including the first phosphor FB1 may be provided adjacent to the light-emitting device LED, and the second sealing part SL2 including the second phosphor FB2 may be provided at a distance from the light-emitting device LED. For example, the second phosphor FB2 included in the second sealing part SL2 may be a red phosphor, which is excited by blue light, and particularly, the second phosphor FB2 may be a KSF phosphor. However, the inventive concepts are not limited thereto. The second phosphor FB2 may include a red phosphor which is excited by near-ultraviolet light rays or blue light in addition to the KSF phosphor. The second sealing part SL2 may be provided on the first sealing part SL1 by a separate process after providing the first sealing part SL1.

The light-emitting device package LD-b shown in FIG. 10 may show higher quantity of emitted light than the light-emitting device package LD of shown in FIG. 5. For example, as shown in FIG. 10, in case where the first phosphor FB1 and the second phosphor FB2 are separately included in the first sealing part SL1 and the second sealing part SL2, respectively, the quantity of near-ultraviolet light rays emitted from the light-emitting device LED may increase when compared to a case where the first phosphor FB1 and the second phosphor FB2 are included in the same sealing part SL.

Figure 11:
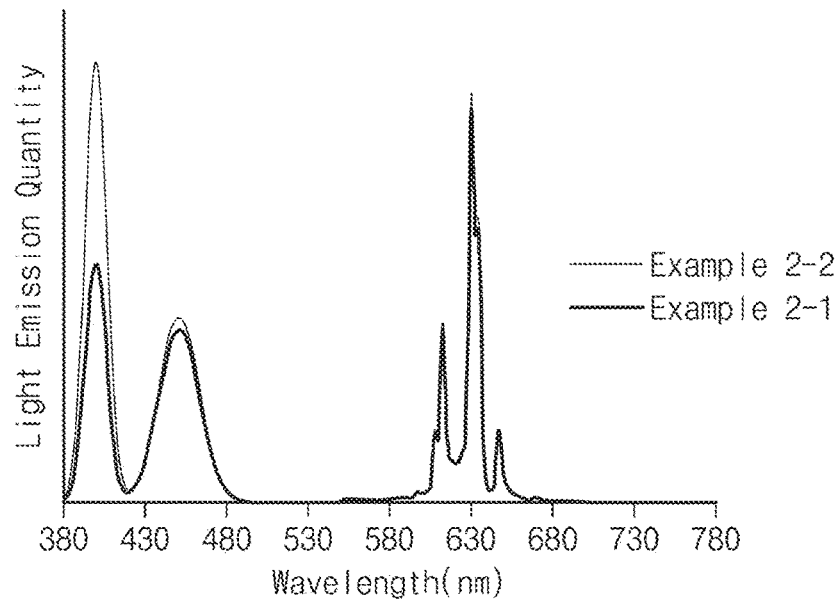
FIG. 11 shows light-emitting spectra of light source members according to exemplary embodiments of the invention.

FIG. 11 is a graph comparing the quantities of emitted light with different configurations of light-emitting devices packages. In FIG. 11, Example 2-1 shows an emission spectrum of a case where a first phosphor FB1 and a second phosphor FB2 are mixed and included in a sealing part SL, as in the light-emitting device packages LD and LD-a shown in FIG. 5 or FIG. 7. In addition, Example 2-2 shows emission spectrum of a case where a first sealing part SL1 including a first phosphor FB1, and a second sealing part SL2 including a second phosphor FB2, are separately provided as in the light-emitting device package LD-b shown in FIG. 10. In both cases of Example 2-1 and Example 2-2, the emission of near-ultraviolet light rays having a central wavelength in a wavelength region of about 390 nm to about 410 nm, blue light having a central wavelength in a wavelength region of about 440 nm to about 460 nm, and red light having a central wavelength in a wavelength region of about 600 nm to about 650 nm was observed. However, it was observed that the quantity of near-ultraviolet light rays of Example 2-2 was significantly increased when compared to Example 2-1, and the quantity of blue light of Example 2-2 was increased a a small amount when compared to Example 2-1. That is, the exemplary embodiment including the light-emitting device package shown in FIG. 10 may show excellent color reproducibility and improved luminance.

Figure 12:
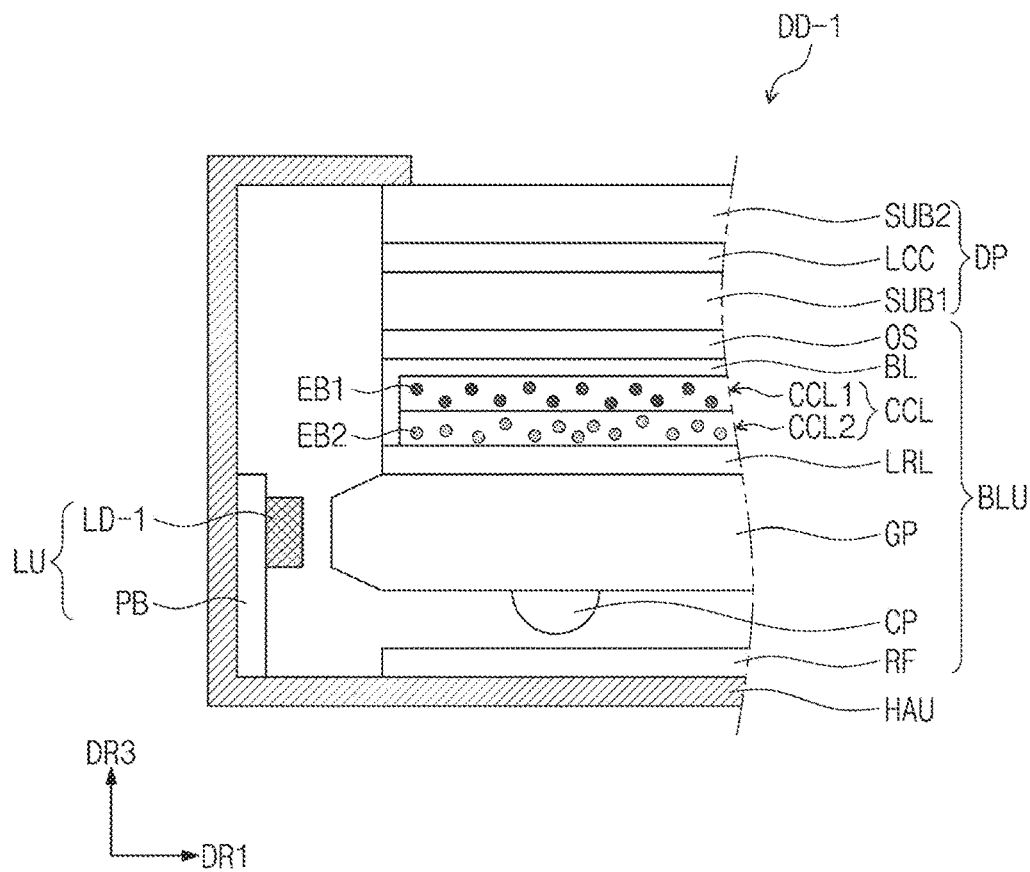
FIG. 12 is a cross-sectional view of a part of a display device of an exemplary embodiment of the invention.

FIG. 12 is a cross-sectional view of a part of a display device DD-1 of an exemplary embodiment. In explaining the display device DD-1 of the exemplary embodiment shown in FIG. 12, overlapping parts with the explanation referring to FIG. 11 will not be explained again, and the explanation will be focused on different features.

Referring to FIG. 12, a display device DD-1 includes a light source member LU, a display panel DP disposed on the light source member LU, and a color conversion layer CCL disposed between the light source member LU and the display panel DP. In the display device DD-1 of FIG. 12, a backlight unit BLU may include optical units transferring light supplied from the light source member LU to the display panel DP. The backlight unit BLU may include a light guide plate GP, a light output pattern part CP, an optical sheet OS, and a reflection layer RF. The color conversion layer CCL may be included in the backlight unit BLU and may be disposed between the light guide plate GP and the display panel DP.

The color conversion layer CCL may include a first color conversion layer CCL1 including a first luminous body EB1 and a second color conversion layer CCL2 including a second luminous body EB2. The first color conversion layer CCL1 may be disposed on the second color conversion layer CCL2. That is, light supplied from the light source member LU may penetrate the second color conversion layer CCL2 first and then, the first color conversion layer CCL1.

Figure 13:
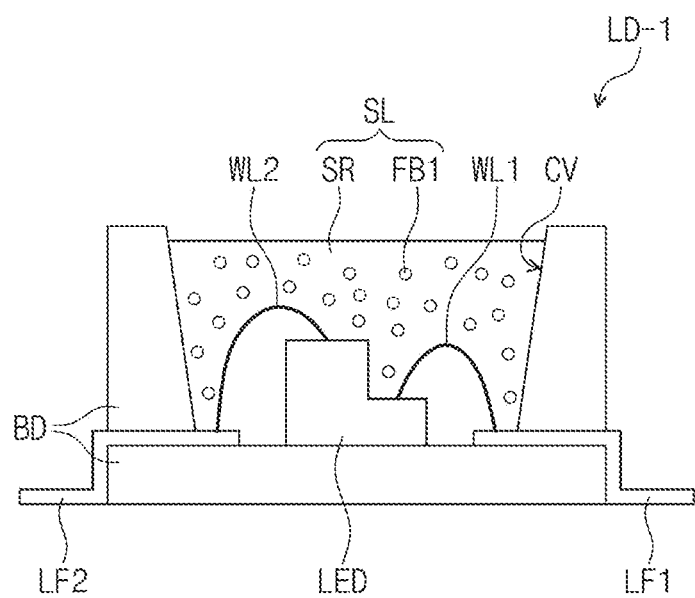
FIG. 13 is a cross-sectional view showing a light-emitting device package according to an exemplary embodiment of the invention.

In the display device DD-1 shown in FIG. 12, the light source member LU may include the light-emitting device package LD-1 shown in FIG. 13. Referring to FIG. 13, the light-emitting device package LD-1 may include a light-emitting device LED, a pair of lead frames LF1 and LF2, and a body part BD. The explanation on the light-emitting device LED, the pair of lead frames LF1 and LF2, and the body part BD of the light-emitting device package LD-1 shown in FIG. 13 will follow the same explanation on the light-emitting device package LD shown in FIG. 5.

The light-emitting device LED may be disposed in the cavity CV of the body part BD and may be electrically connected via connecting wires WL1 and WL2 with the lead frames LF1 and LF2, which are exposed in the cavity CV. In the cavity CV, a sealing part SL wrapping the light-emitting device LED while filling the cavity CV may be disposed. The sealing part SL may include a filling resin SR and a first phosphor FB1. The filling resin SR may use an epoxy resin or an acrylic resin, and the first phosphor FB1 may be a blue phosphor which converts near-ultraviolet light rays, i.e., a first light emitted from the light-emitting device LED to a second light having a central wavelength in a wavelength region of about 440 nm to about 460 nm. That is, the light-emitting device package LD-1 shown in FIG. 13 may emit near-ultraviolet light rays having a central wavelength in a wavelength region of about 390 nm to about 410 nm and blue light having a central wavelength in a wavelength region of about 440 nm to about 460 nm.

Referring to FIG. 12 again, the first color conversion layer CCL1 may include a first luminous body EB1 which is excited by at least one light among a first light having a central wavelength in a wavelength region of about 390 nm to about 410 nm and a second light having a central wavelength in a wavelength region of about 440 nm to about 460 nm, supplied from the light source member LU, and emits a fourth light having a central wavelength in a wavelength region of about 520 nm and about 550 nm. That is, the first color conversion layer CCL1 may include a first luminous body EB1 which emits green light. The first luminous body EB1 may be excited by the first light which corresponds to near-ultraviolet light rays, and emit light, and thus, may show high emission efficiency. In addition, the first luminous body DB1 may be also excited by the second light which is blue light and emit light. The first luminous body EB1 may be a green quantum dot which is excited by at least one of near-ultraviolet light rays or blue light and emits green light.

The second color conversion layer CCL2 may include a second luminous body EB2 which is excited by at least one light among the first light having a central wavelength in a wavelength region of about 390 nm to about 410 nm and the second light having a central wavelength in a wavelength region of about 440 nm to about 460 nm, supplied from the light source member LU, and emits a third light having a central wavelength in a wavelength region of about 600 nm and about 650 nm. The second luminous body EB2 may be a red quantum dot which is excited by near-ultraviolet light rays and emits red light. In addition, the second luminous body EB2 may be a red quantum dot which is excited by blue light and emits red light. The second luminous body EB2 may be a red phosphor. For example, the second luminous body EB2 may be excited by blue light and emit red light. Particularly, the second luminous body EB2 may include a KSF phosphor.

The display device DD-1 may further include a barrier layer BL disposed on the color conversion layers CCL1 and CCL2. Referring to FIG. 12, the barrier layer BL may cover the first and second color conversion layers CCL1 and CCL2. However, the inventive concepts are not limited thereto and, although not shown in the drawings, a barrier layer may be added between the first color conversion layer CCL1 and the second color conversion layer CCL2. Alternately, the barrier layer BL may cover the first color conversion layer CCL1 while exposing the second color conversion layer CCL2.

With respect to the light guide plate GP, the light output pattern part CP, the low refractive layer LRL, the optical sheet OS and the reflection layer RF included in the backlight unit BLU, the same explanation referring to FIGS. 2 to 4 may be applied.

Referring to FIGS. 12 and 13, the display device DD-1 includes the light source member LU, which includes the light-emitting device LED which emits near-ultraviolet light rays, and the first phosphor FB1 which is excited by near-ultraviolet light rays and emits blue light, and includes the second color conversion layer CCL2 and the first color conversion layer CCL1 laminated in order from the light source member LU, thereby showing excellent color reproducibility and improved luminance properties.

That is, in the display device DD-1, the second color conversion layer CCL2, which emits red light in a relatively long wavelength region, is disposed ahead of the first color conversion layer CCL1 in a light path, and the absorption of light emitted from the first color conversion layer CCL1 in the second luminous body EB2 of the second color conversion layer CCL2 may be prevented.

Figure 14:
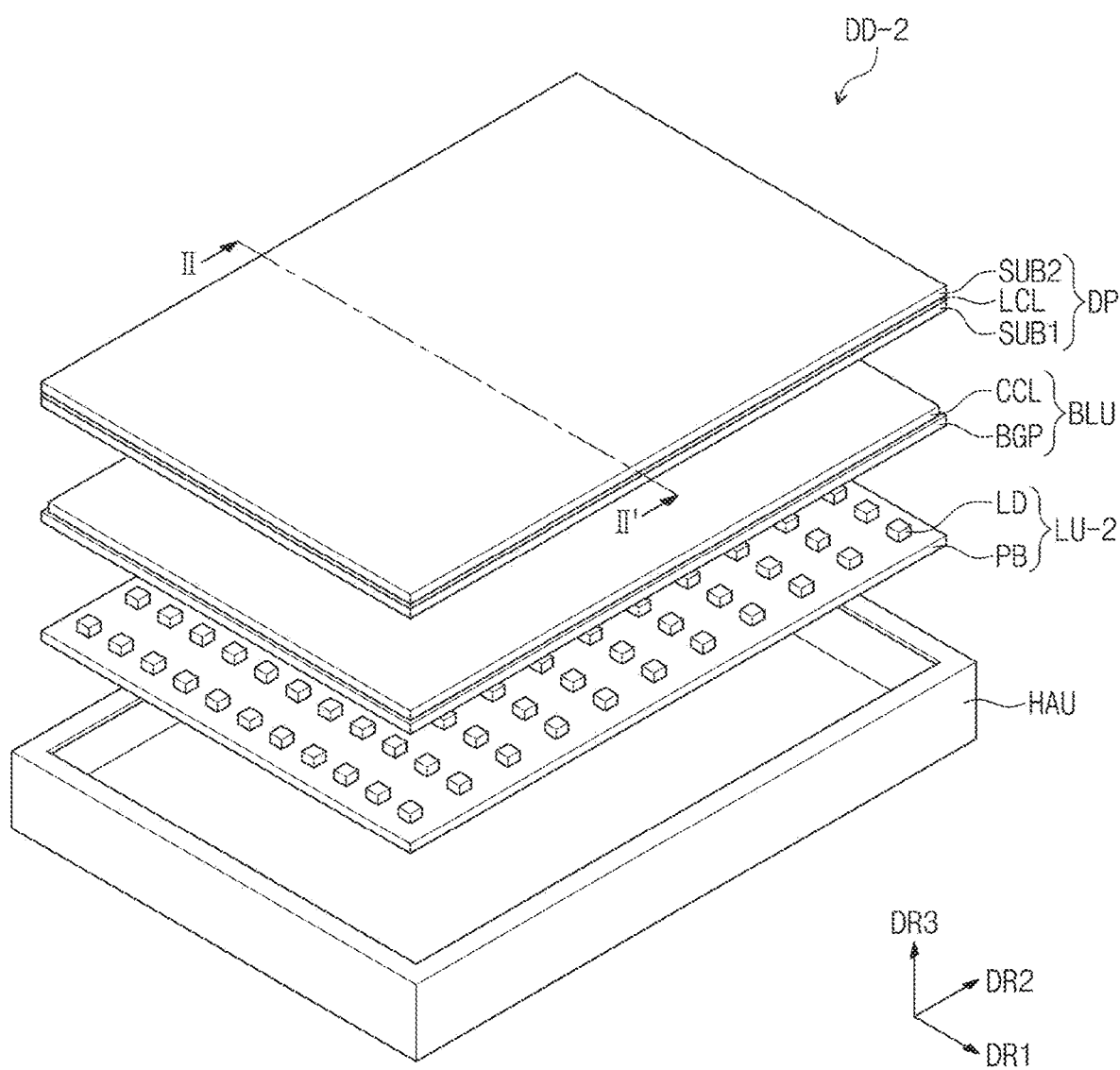
FIG. 14 is an exploded perspective view of a display device of an exemplary embodiment of the invention.
Figure 15:
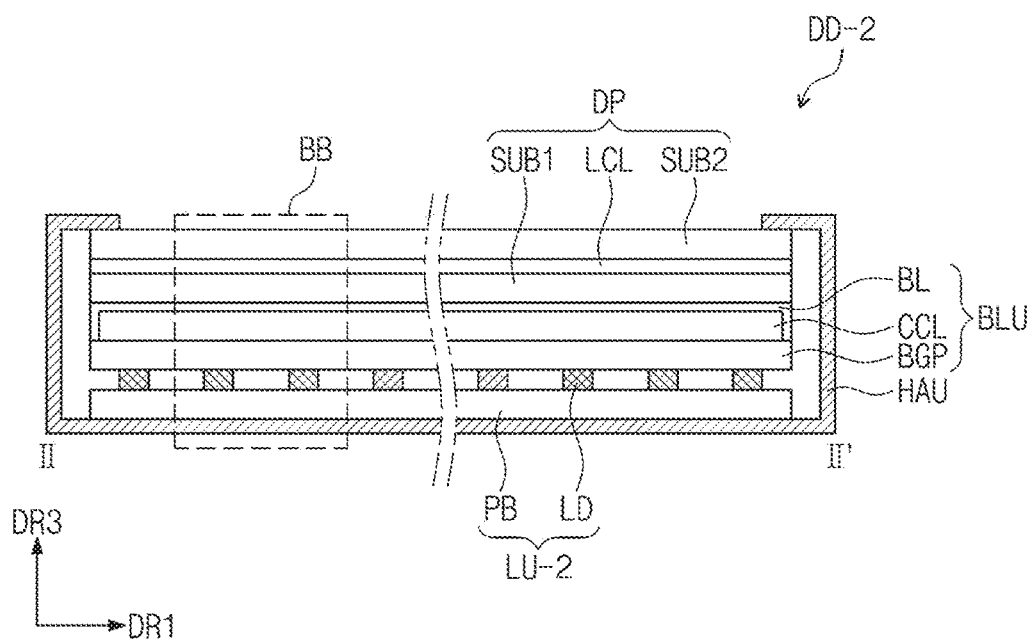
FIG. 15 is a cross-sectional view of a part corresponding to line II-II' of FIG. 14.
Figure 16:
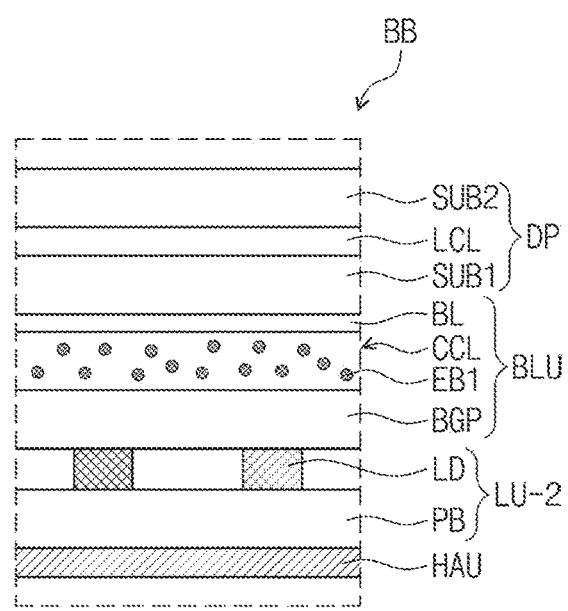
FIG. 16 is an enlarged view of a BB region of FIG. 15.
Figure 17:
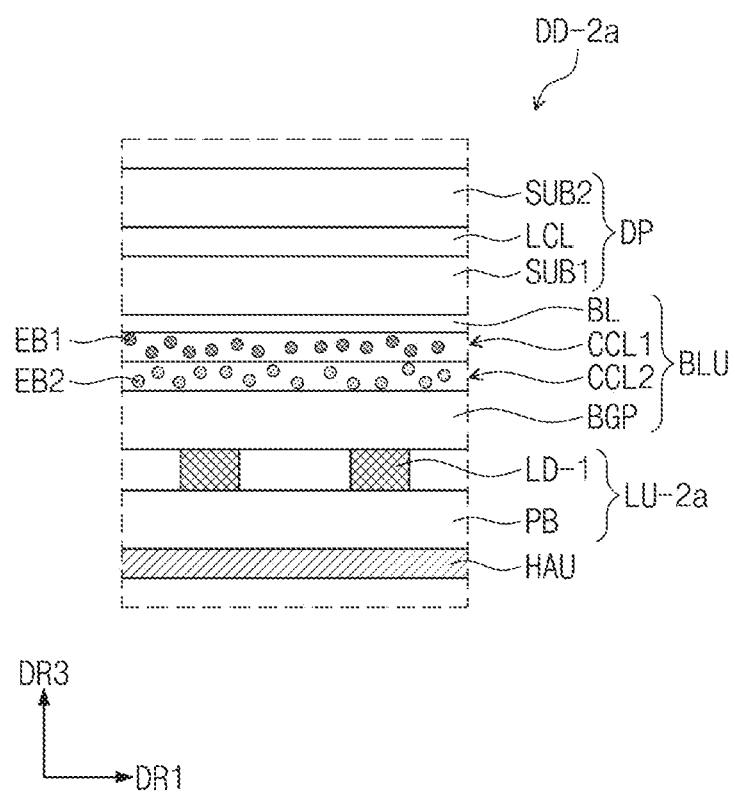
FIG. 17 is a cross-sectional view of a part of a display device of an exemplary embodiment of the invention.

FIG. 14 is an exploded perspective view of a display device of another exemplary embodiment. FIG. 15 is a cross-sectional view of a surface corresponding to line II-II' of FIG. 14, and FIG. 16 is an enlarged view of a BB region of FIG. 15. FIG. 17 is a cross-sectional view of a part of a display device.

Referring to FIGS. 14 to 16, a display device DD-2 may include a light source member LU-2, a display panel DP disposed on the light source member LU-2, and a color conversion layer CCL provided between the light source member LU-2 and the display panel DP.

The color conversion layer CCL may include a first luminous body EB1. The first luminous body EB1 may be a quantum dot. The first luminous body EB1 may be excited by at least one light among a first light having a central wavelength in a wavelength region of about 390 nm to about 410 nm and a second light having a central wavelength in a wavelength region of about 440 nm to about 460 nm, supplied from the light source member LU-2, and emits a fourth light having a central wavelength in a wavelength region of about 520 nm and about 550 nm. For example, the first luminous body EB1 may be a green quantum dot which is excited by at least one of near-ultraviolet light rays or blue light and emits green light. With respect to the first luminous body EB1, the same explanation on the first luminous body EB1 referring to FIGS. 2 to 4 may be applied.

The color conversion layer CCL may be provided on the light source member LU-2 as a backlight unit BLU together with a base substrate BGP which supports the color conversion layer CCL. The color conversion layer CCL may be provided directly on the base substrate BGP. The color conversion layer CCL may be provided on the base substrate BGP by to using a coating process. For example, the first luminous body EB1 may be supplied on the base substrate BGP by using a coating process to form the color conversion layer CCL.

The inventive concepts are not limited thereto, and the base substrate BGP may be omitted. The color conversion layer CCL may be provided as a separate unit. For example, the color conversion layer CCL may include a base resin. The first luminous body EB1 may be dispersed in the base resin. The base resin may be a polymer resin. A color conversion layer CCL obtained by dispersing the first luminous body EB1 in the base resin and processing by a separate process may be provided between the light source member LU-2 and the display panel DP.

On the color conversion layer, a barrier layer BL may be disposed. The barrier layer may cover the color conversion layer CCL. The barrier layer BL may protect the color conversion layer CCL from moisture or oxygen to prevent the exposure of the first phosphor FB1 to external environment, thereby achieving excellent reliability.

In addition, the base substrate BGP may be a diffusion plate. The base substrate BGP may be disposed on the light source member LU-2 to diffuse light emitted from the light-emitting device package LD of the light source member LU-2 and incident to the base substrate BGP and increase luminance uniformity.

The light source member LU-2 may be disposed under the color conversion layer CCL. The light source member LU-2 may be disposed under the display panel DP. The light source member LU-2 may be disposed in an overlapped state with the display panel DP and, different from the display device DD of the exemplary embodiment shown in FIG. 2, the display device DD-2 shown in FIG. 14 may be a display device having a direct type light source member.

The light source member LU-2 may include a circuit substrate PB and a plurality of light-emitting device packages LD disposed on the circuit substrate PB. The plurality of the light-emitting device packages LD may be separated from each other and arranged and disposed on the circuit substrate PB. The arrangement thereof is not limited to that shown in FIG. 14.

The light-emitting device package LD may include a light-emitting device emitting a first light having a central wavelength in a wavelength region of about 390 nm to about 410 nm and a first phosphor for converting the first light into a second light having a central wavelength in a wavelength region of about 440 nm to about 460 nm. In addition, the light-emitting device package LD may further include a second phosphor converting the second light into a third light having a central wavelength in a wavelength region of about 600 nm to about 650 nm.

As shown in FIGS. 14 to 16, the light-emitting device package LD of FIG. 5, or the light emitting device package LD-a or LD-b of FIG. 7 or FIG. 10 may be used as the light-emitting device package LD. In the display device DD-2 shown in FIGS. 14-16, the light source member LU-2 may emit near-ultraviolet light rays having a central wavelength in a wavelength region of about 390 nm to about 410 nm, blue light having a central wavelength in a wavelength region of about 440 nm to about 460 nm, and red light having a central wavelength in a wavelength region of about 600 nm to about 650 nm. At least a part of the near-ultraviolet light rays and the blue light emitted from the light source member LU-2 and incident to the color conversion layer CCL may be absorbed by a first luminous body EB1, and the first phosphor EB1 may be excited to emit green light.

Accordingly, in the display device DD-2 shown in FIGS. 14-16, white light from the color conversion layer CCL may be supplied to the display panel DP. White light, which is a mixture of blue light, red light and green light, may be supplied to the display panel DP. The display device DD- may include a second phosphor in the light-emitting device package LD and may include a light source member LU-2 emitting blue light and red light. In addition, in the display device DD-2, the color conversion layer CCL including the first luminous body EB1 which is a green quantum point is disposed on the light source member LU-2 and may show improved emission efficiency when compared to a case where a second phosphor converting into red light is disposed on a color conversion layer CCL. That is, in the display device DD-2, the second phosphor is disposed ahead of the first phosphor in a light path, and the absorption of light emitted from the first luminescence material EB1 which is a green quantum dot by the second phosphor again may be prevented, and efficiency of light emitted from the first luminous body EB1 may increase.

FIG. 17 is a cross-sectional view showing a part of a display device. For example, FIG. 17 may show a part corresponding to a BB region of FIG. 15. Referring to FIG. 17, a display device DD-2a of another exemplary embodiment may be disposed under a display panel DP and may include a light source member LU-2a which is overlapped with the display panel DP. Between the light source member LU-2a and the display panel DP, color conversion layers CCL1 and CCL2 may be disposed. When comparing with the display device of an embodiment as shown in FIG. 16, the display device DD-2a of FIG. 17 may include two laminated color conversion layers CCL1 and CCL2.

The light source member LU-2a may include a circuit substrate PB and a plurality of light-emitting device packages LD-1 disposed on the circuit substrate PB. The same explanation on the light-emitting device package LD-1 referring to FIG. 13 may be applied to the light-emitting device package LD-1 used in FIG. 17. That is, the light-emitting device package LD-1 may include a light-emitting device emitting a first light having a central wavelength in a wavelength region of about 390 nm to about 410 nm and a first phosphor converting the first light into a second light having a central wavelength in a wavelength region of about 440 nm to about 460 nm. The light-emitting device package LD-1 may emit near-ultraviolet light rays and blue light.

The display device DD-2a of this exemplary embodiment may include a first color conversion layer CCL1 including a first luminous body EB1 and a second color conversion layer CCL2 including a second luminous body EB2. The first luminous body EB1 may be excited by at least one light among a first light having a central wavelength in a wavelength region of about 390 nm to about 410 nm and a second light having a central wavelength in a wavelength region of about 440 nm to about 460 nm and emit a fourth light having a central wavelength in a wavelength region of about 520 nm and about 550 nm. For example, the first luminous body EB1 may be a phosphor which is excited by at least one of near-ultraviolet light rays or blue light and emits green light. Particularly, the first luminous body EB1 may be a green quantum dot. The same explanation on the first luminous body EB1 shown in FIGS. 1 to 7 may be applied to the first luminous body EB1 above.

The display device DD-2a of this exemplary embodiment may include the second color conversion layer CCL2, and the second color conversion layer CCL2 may be disposed closer to the light source member LU-2a than the first color conversion layer CCL1. The second color conversion layer CCL2 may include a second luminous body EB2, and the second luminous body EB2 may be excited by at least one light among a first light having a central wavelength in a wavelength region of about 390 nm to about 410 nm and a second light having a central wavelength in a wavelength region of about 440 nm to about 460 nm and emit a third light having a central wavelength in a wavelength region of about 600 nm and about 650 nm. For example, the second luminous body EB2 may be a luminous body which is excited by at least one of near-ultraviolet light rays or blue light and emits red light. The second luminous body EB2 may be a red quantum dot or a red phosphor. Particularly, the second luminous body EB2 may be a KSF phosphor which is excited by blue light. However, the inventive concepts are not limited thereto.

On the color conversion layers CCL1 and CCL2, a barrier layer BL may be disposed. The barrier layer BL may be disposed on the first color conversion layer CCL1. The barrier layer BL may cover the first color conversion layer CCL1 and the second color conversion layer CCL2. Alternatively, the barrier layer may cover only the first color conversion layer CCL1.

Light emitted from the light source member LU-2a may be supplied as white light via the color conversion layers CCL1 and CCL2 to the display panel DP. The light-emitting device package LD-1 of the light source member LU-2a may emit near-ultraviolet light rays and blue light, the second color conversion layer CCL2 may emit red light which has been converted by the second luminous body EB2, and the first color conversion layer CCL1 may emit green light which has been converted by the first luminous body EB1. That is, white light obtained by mixing the blue light emitted from the light-emitting device package LD-1, the red light emitted from the second color conversion layer CCL2, and the green light emitted from the first color conversion layer CCL1 may be supplied to the display panel DP.

The display device DD-2a includes the light-emitting device which emits near-ultraviolet light rays in the light source member LU-2a, and may show excellent color reproducibility and improved emission efficiency. In addition, in the display device DD-2a of this exemplary embodiment, the second color conversion layer CCL2, which emits red light in a relatively long wavelength region, is disposed under the first color conversion layer CCL1, and the absorption of light emitted from the first luminous body EB1 by the second luminous body EB2 may be prevented, thereby showing improved emission efficiency.

The display device of the invention includes a light-emitting device which emits near-ultraviolet light rays having a shorter wavelength than the wavelength region of blue light and improves the emission efficiency of a phosphor and a luminous body, which are excited by the light-emitting device and emit light, thereby maintaining excellent color reproducibility and showing a high luminance value. In addition, in the display device of the invention, a phosphor or a luminous body converting into red light is disposed ahead of a luminous body converting into green light, and the absorption of green light corresponding to relatively short wavelength light by the phosphor or luminous body converting into red light may be prevented, and thus, improved luminous efficiency may be achieved.

An exemplary embodiment may provide a display device which includes a light-emitting device emitting near-ultraviolet light rays in a light source member, and a color conversion layer including a quantum dot, and has high luminous efficiency and color reproducibility.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a light source member comprising:
      a light-emitting device configured to emit a first light having a central wavelength in a wavelength region of about 390 nm to about 410 nm; and
      a first phosphor configured to convert the first light into a second light having a central wavelength in a wavelength region of about 440 nm to about 460 nm;
   a display panel disposed on the light source member; and
   a color conversion layer disposed between the light source member and the display panel and comprising a luminous body which, when excited by at least one of the first light and the second light, is configured to emit a light in a wavelength region which is different from that of the second light.

2. The display device of claim 1, wherein the light source member further comprises a second phosphor configured to convert the second light into a third light having a central wavelength in a wavelength region of about 600 nm to about 650 nm.

3. The display device of claim 2, wherein:
   the light source member further comprises a sealing part covering the light-emitting device, and
   the first phosphor and the second phosphor are comprised in the sealing part.

4. The display device of claim 2, wherein the light source member further comprises:
   a first sealing part covering the light-emitting device and comprising the first phosphor; and
   a second sealing part disposed on the first sealing part and comprising the second phosphor.

5. The display device of claim 2, wherein the color conversion layer comprises a first luminous body which, when excited by the first light and the second light, is configured to emit a fourth light having a central wavelength in a wavelength region of about 520 nm to about 550 nm.

6. The display device of claim 1, wherein the display device comprises:
   a first color conversion layer comprising a first luminous body which, when excited by at least one of the first light and the second light, is configured to emit a fourth light having a central wavelength in a wavelength region of about 520 nm to about 550 nm; and
   a second color conversion layer disposed between the light source member and the first color conversion layer, the second color conversion layer comprising a second luminous body which, when excited by at least one of the first light and the second light, is configured to emit a third light having a central wavelength in a wavelength region of about 600 nm to about 650 nm.

7. The display device of claim 6, wherein the first luminous body is a green quantum dot.

8. The display device of claim 6, wherein the second luminous body is a red phosphor or a red quantum dot.

9. The display device of claim 1, further comprising a light guide plate disposed between the light source member and the display panel, wherein the light source member is disposed adjacent to at least one side of the light guide plate.

10. The display device of claim 9, wherein:
    the color conversion layer is disposed on the light guide plate; and
    the display device further comprises a low refractive layer disposed between the light guide plate and the color conversion layer, the low refractive layer having a smaller refractive index than the light guide plate.

11. The display device of claim 1, wherein:
    the light source member is disposed under the color conversion layer; and
    the light source member is overlapped with the display panel.

12. The display device of claim 1, further comprising a barrier layer disposed on the color conversion layer and covering the color conversion layer.

13. The display device of claim 1, wherein the light-emitting device comprises:
    a first conductive-type semiconductor layer;
    an active layer disposed on the first conductive-type semiconductor layer and comprising InGaN; and
    a second conductive-type semiconductor layer disposed on the active layer.

14. A display device, comprising:
    a light source member comprising:
       a light-emitting device configured to emit near-ultraviolet light rays; and
       a blue phosphor configured to convert the near-ultraviolet light rays into blue light;
    a display panel disposed on the light source member; and
    a color conversion layer disposed between the light source member and the display panel and comprising a luminous body which, when excited by at least one of the near-ultraviolet light rays and the blue light, is configured to emit a light in a wavelength region which is different from that of the blue light.

15. The display device of claim 14, wherein the light source member further comprises a red phosphor configured to convert the blue light into red light.

16. The display device of claim 15, wherein the luminous body comprises a green quantum dot.

17. The display device of claim 14, wherein the color conversion layer comprises:

a first color conversion layer comprising a green quantum dot; and a second color conversion layer disposed under the first color conversion layer and comprises a red phosphor.

18. A display device, comprising:
a display panel;
a light guide plate disposed under the display panel;
a light source member disposed adjacent to at least one side of the light guide plate; and
a color conversion layer disposed between the display panel and the light guide plate,
wherein:
the light source member comprises:
    a light-emitting device comprising an active layer comprising InGaN and not comprising AlGaN, and configured to emit near-ultraviolet light rays;
    a blue phosphor configured to convert the near-ultraviolet light rays into blue light; and
    a red phosphor configured to convert the blue light into red light; and
the color conversion layer comprises a quantum dot which, when excited by at least one light of the near-ultraviolet light rays or the blue light, is configured to emit green light.

19. The display device of claim 18, wherein the light-emitting device is configured to emit the near-ultraviolet light rays which have a central wavelength in a wavelength region of about 390 nm to about 410 nm.

20. The display device of claim 18, wherein the light source member comprises:
    a first sealing part disposed on the light-emitting device and comprising the blue phosphor; and
    a second sealing part disposed on the first sealing part and comprising the red phosphor.

* * * * *